United States Patent [19]

Plucinski et al.

[11] Patent Number: 5,263,537
[45] Date of Patent: Nov. 23, 1993

[54] OSCILLATING COOLING SYSTEM

[75] Inventors: Mark D. Plucinski, Endwell; William C. Miller, Owego, both of N.Y.

[73] Assignee: International Business Machines Corporation, Armonk, N.Y.

[21] Appl. No.: 874,463

[22] Filed: Apr. 27, 1992

[51] Int. Cl.⁵ .............................................. F28F 13/06
[52] U.S. Cl. .................................. 165/97; 165/109.1; 165/104.34; 361/687; 361/695
[58] Field of Search ................ 165/97, 109.1, 104.34; 361/384

[56] References Cited

U.S. PATENT DOCUMENTS

| | | | |
|---|---|---|---|
| 3,387,648 | 6/1968 | Ward, Jr. et al. | 165/104.34 |
| 3,812,534 | 5/1974 | Rousseau et al. | 360/98 |
| 4,582,765 | 4/1986 | Kothmann | 165/97 |
| 4,648,007 | 3/1987 | Garner | 361/384 |

FOREIGN PATENT DOCUMENTS

| | | |
|---|---|---|
| 722860 | 7/1942 | Fed. Rep. of Germany ...... 361/384 |
| 157173 | 12/1980 | Japan . |
| 145573 | 11/1981 | Japan . |
| 165963 | 12/1981 | Japan . |
| 167178 | 10/1982 | Japan . |
| 129497 | 5/1989 | Japan . |
| 297892 | 11/1989 | Japan . |
| 54998 | 2/1990 | Japan . |
| 979828 | 12/1982 | U.S.S.R. ................................ 165/903 |

OTHER PUBLICATIONS

Perkins et al, J. S., IEEE Trans. on Components, Hybrids, & Mfg. Tech. vol. 12, No. 4, Dec. 1989, Mixing Enhancements in Flow Past Rectangular Cavities as a Result of Periodically . . . .

Primary Examiner—Albert W. Davis, Jr.
Attorney, Agent, or Firm—Lynn A. Augspurger; Lawrence R. Fraley

[57] ABSTRACT

A computer cooling system provides a more efficient means of cooling, resulting in lower average temperatures and better reliability for the system. It comprises of a rotating baffle or set of baffles, and a formed enclosure. The enclosure accepts cooling fluid in a direction that is parallel to one of its walls. The enclosure is such that a recirculating airflow pattern is set up in its cavity. As the baffle rotates the direction of fluid flow reverses itself in the cavity of the enclosure. The turbulence created by such a system greatly enhances the rate of heat transfer on the components within the enclosure. The exact dimensions of the baffle, and frequency with which it oscillates will depend on the specific system.

8 Claims, 2 Drawing Sheets

OSCILLATING COOLING SYSTEM

FIELD OF THE INVENTION

These inventions relate to electronic systems and particularly to card on board electronic packages.

GLOSSARY OF TERMS

Thermal Boundary Layer
  The layer of fluid which contains the vast majority of the temperature gradient from the heated surface to the ambient fluid.
Solenoid
  Mechanical device that switches from one position to another and is driven by an electric current.
Turbulent fluid
  Fluid in which the path of any one particle moves in an irregular path, but on average the overall motion of all of the fluid particles is regular. Turbulent fluid is associated with higher rates of heat transfer because of the increased mixing of the molecules.

BACKGROUND OF THE INVENTION

As background for our invention reference can be had to pulsed fluid motion as described by Perkins, Ktra, Stephanoff, and Murray. A detailed description can be found in Vol. 12, No. 4 of the IEEE Transactions on Components, Hybrids, and Manufacturing Technology, dated December 1989. Basically the flow described by Perkins, et. al. contains two parts, a steady state component and an oscillatory component. The oscillation is such that there is always a net velocity in the same direction. This type of flow in an electronics cavity tends to periodically replace fluid trapped within small cavities such as between modules. As a result of this periodic motion of the fluid, local velocities in the cavities are higher than compared with steady state flow.

This article describes the process by which heat transfer rates are increased, however it does not say how this motion is to be generated. It does say that a positive net airflow is required to carry the heat away.

One possible technique to obtain pulsed flow is to use a breathing cooling system. This has been described by Dr. Victor Nee of the University of Notre Dame. In this scheme a pivoted baffle is turned back and forth repeatedly. Airflow is constantly accelerating, thereby achieving local heat transfer gains as described by Perkins. However, this technique suffers from the fact that the net flow is approximately zero. For modest power dissipations the air temperature rise will overpower the gains realized in heat transfer coefficient. A fan will be needed in addition to the breathing device in order to cool the electronics system. It is not clear how the fan and breathing system will interact because the breathing system will generate a large amount of pressure which may overpower some fans. Moreover, two air circuits may be required instead of just one.

Dr. Nee disclosed his work to others, but we have found no publication or patent related to this work.

The patent art about baffles does not seem to be particularly applicable to our oscillating baffle concept.

German Patent No. 722860, dated Jul. 23, 1942, has a sketch which appears to show using a moveable baffle to alter the path of a fluid. From the sketch it appears as though the purpose of the baffles are to redirect mass flow to completely different sources at different points in time. This method appears to be a control scheme and not an augmentation to heat transfer.

The purpose of Japanese patent number 2-54998, dated February 1990, entitled "Air-Cooling Fan Unit," is to provide an easy means to control the airflow that passes over electronics. This method uses the concept of higher velocity and more airflow to achieve higher rates of heat transfer. We note that in this method the more cooling airflow that is delivered to one hot spot will means that less airflow is delivered to another. No mention is made of using added turbulence to increase the rate of heat transfer.

The purpose of Japanese patent number 1-297892, dated November 1989, entitled "Air Guiding Apparatus for Cabinet," is to control the mass flow through an electronic enclosure. This concept uses a variable baffle that can be rearranged to direct volumes of airflow through an enclosure. This concept could be useful for design, where many packages of a similar type are used. The method is primarily concerned with controlling the inlet and outlet airflow conditions within an enclosure and not with the rate of heat transfer imposed by the changed baffles.

The purpose of Japanese patent number 1-129497, dated May 1989, entitled "Cooling System for LSI Element of Electronic Equipment," is to control the rate of heat transfer by varying the airflow rate as a function of inlet or outlet air temperature. This patent does not mention the use of increased turbulence created by the baffle to augment heat transfer.

The purpose of Japanese patent number 57-167178, dated October 1982, entitled "Driving Method of Magnetic Disk Device," is to obtain uniform temperature fields on start up of magnetic disk. This patent does not use an oscillating type of flow, nor does it discuss augmentation of heat transfer via increased turbulence.

The purpose of Japanese patent number 55-68162, dated December 1981, entitled "Entilating System," is to baffle the airflow generated in a magnetic disk. This system augments heat transfer by increasing the rate of airflow by capturing and saving that airflow. No method of adding turbulence is discussed, other than just increasing the rate of flow.

The purpose of Japanese patent number 55-157173, dated December 1980, entitled "Magnetic Disc Device," is to maintain a uniform temperature distribution surrounding a Magnetic disc. The system employs a rotating baffle relative to the disc, however, the mixing of airflow is taking place in the baffle and not on the disc. The thermal boundary layer set up is steady state in nature. No mention is made of augmentation of heat transfer to lower the temperature but to make the air temperature distribution uniform. Moreover, the airflow is not pulsed to obtain this mixing, a specially designed airflow guide is used to push airflow through the disc.

The purpose of Japanese patent number 56-145573, dated November 1981, entitled "Disc Device for Computer or the Like," is to circulate airflow through an air filter. No mention is made of any augmentation to the rate of heat transfer via added turbulence.

The purpose of U.S. Pat. No. 4,648,007, dated Mar. 3, 1987, entitled "Cooling Module for Electronic Equipment," is to create a system of baffles that enable a system to receive cooling airflow when a fan has failed. No mention is made of augmenting the rate of heat transfer by increasing the turbulence.

The purpose of U.S. Pat. No. 3,812,534, dated May 21, 1974, entitled "Ventilation Device for a Magnet Disk Unit," is to allow a vent for a disk unit that does not allow contaminated airflow to enter. The patent discusses a situation in which there is a pulsating airflow, however, there is no description of how that airflow assists in heat transfer.

SUMMARY OF THE INVENTION

The improvements which we have made achieve lower average temperatures for electronic components, and therefore, enhance the reliability of these components.

These improvements are accomplished by providing a mechanized baffle and a specifically designed electronics housing. The cooling fluid enters the housing in a special way. With slight changes in the position of the mechanized baffle the fluid patterns inside the housing become reversed.

Our invention is particularly useful for a computer cooling system. Our cooling system provides a more efficient means of cooling, resulting in lower average temperatures and better reliability for the system. It comprises of a rotating baffle or set of baffles, and a formed enclosure. The enclosure accepts cooling fluid in a direction that is parallel to one of its walls. The enclosure is such that a recirculating airflow pattern is set up in its cavity. As the baffle rotates the direction of fluid flow reverses itself in the cavity of the enclosure. The turbulence created by such a system greatly enhances the rate of heat transfer on the components within the enclosure. The exact dimensions of the baffle, and frequency with which it oscillates will depend on the specific system.

These and other improvements are set forth in the following detailed description. For a better understanding of the inventions with advantages and features, reference may be had to the description and to the drawings.

BRIEF DESCRIPTION OF THE DRAWINGS

The invention is summarized in FIGS. 1 and 2. Both figures depict steady state flow that would occur if the system were to remain in these orientations for an extended period of time. In actuality the system is constantly oscillating between states as depicted in FIGS. 1 and 2.

Our detailed description explains the preferred embodiments of our inventions, together with advantages and features, by way of example with reference to the following drawings.

DETAILED DESCRIPTION OF THE INVENTION

The essence of the invention is that in the electronic cavities as described herein the fluid flow quickly and completely reverses direction. This rapid and radical change in fluid pattern tends to keep the cool fluid in contact with the hot electronics, thereby keeping the electronics cooler than if there was no change in fluid direction.

THE PREFERRED EMBODIMENT

Figure 1:
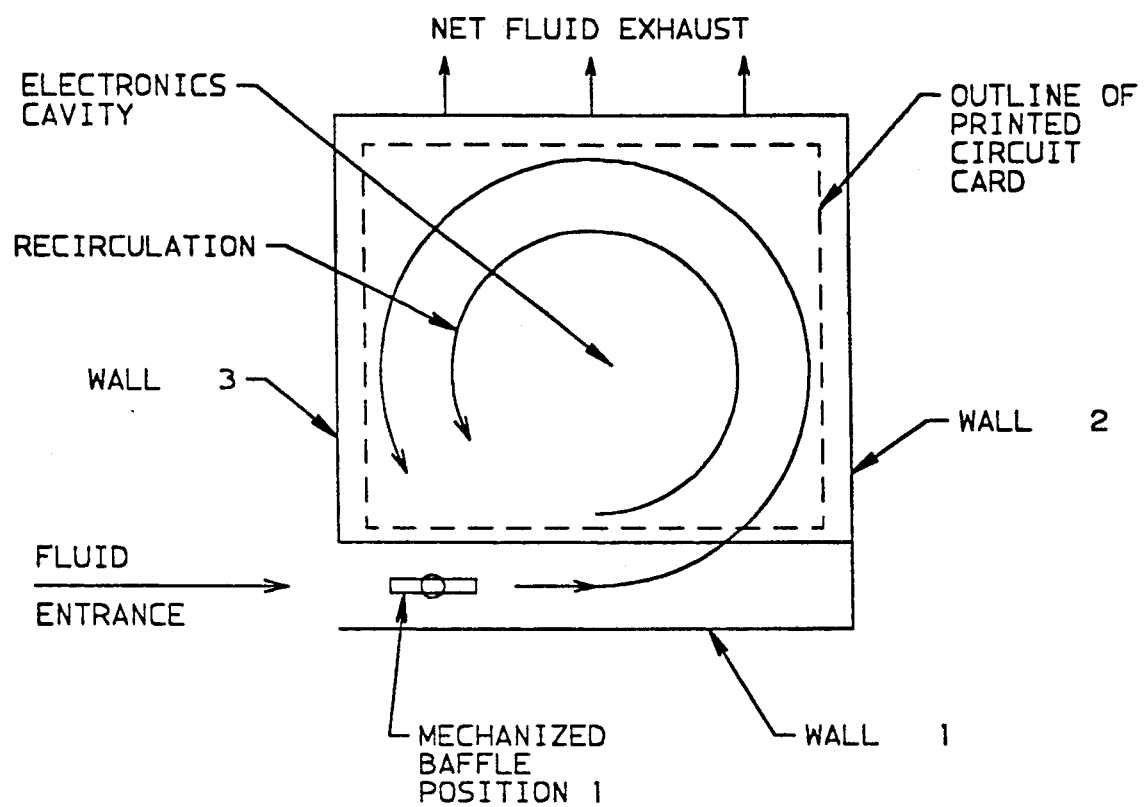
FIG. 1 shows schematically an overview of the preferred embodiment and particularly shows an electronics cavity with fluid entering the cavity near a wall with the mechanized baffle not interrupting the path of the fluid.

Turning now to our inventions in greater detail, it will be seen that FIG. 1 illustrates our preferred embodiment in which it shows schematically an over-view of the preferred embodiment and particularly shows an electronics cavity with fluid entering the cavity near a wall. In this Figure wall #1 is the bottom of the cavity. Note that the electronics inside the cavity could be a series of printed circuit cards. The fluid entering the cavity is essentially unaffected by the mechanized baffle. It flows right over this baffle and the net fluid tends to follow the wall until it runs into wall #2 at the end of the cavity. Here the fluid is again forced to follow the wall. As the fluid comes to end of this wall the net amount of fluid exits from the cavity. The driving force could be a fan that is pulling airflow through this system. Some fluid will not exit the system, but will recirculate back into the cavity. A net circulatory path of the fluid has been created. In this case a counterclockwise flow path is set up by the mechanized baffle in position #1.

Figure 2:
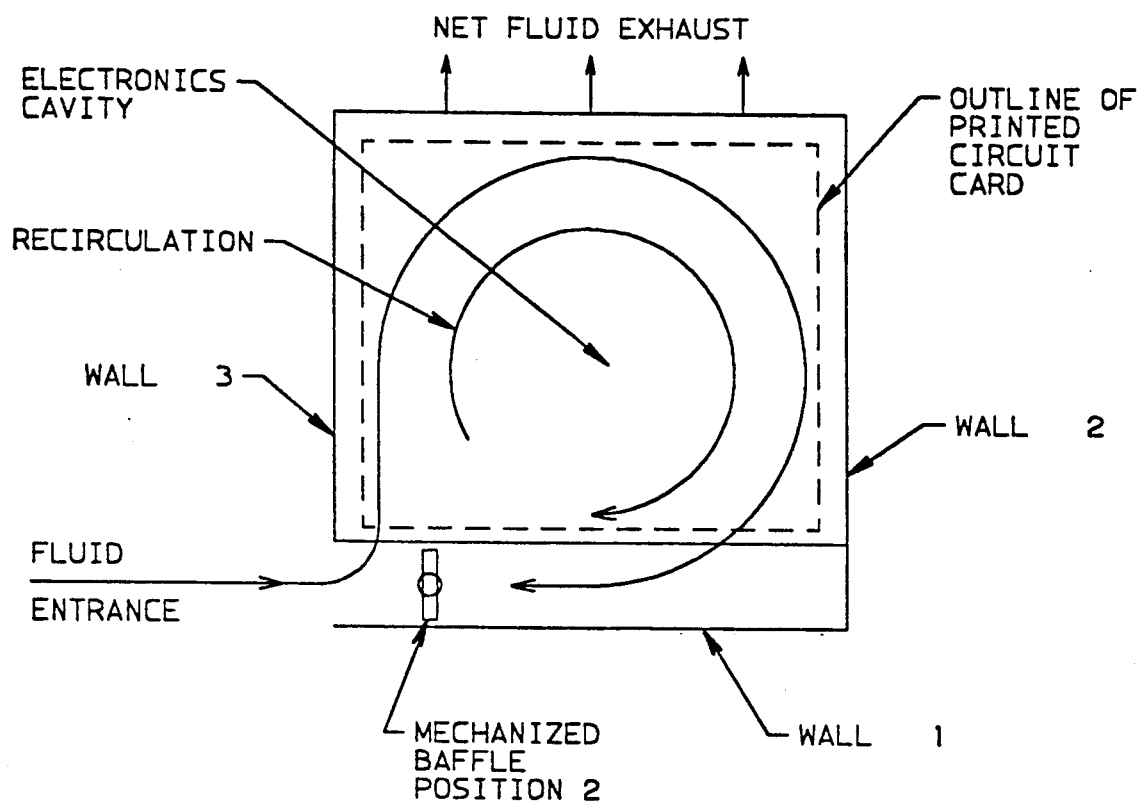
FIG. 2 shows the same electronics cavity as in FIG. 1; however, the mechanized baffle has been move to position #2.

FIG. 2 shows the same electronics cavity as in FIG. 1, however, the mechanized baffle has been moved to position #2. As the fluid enters the cavity it runs into the mechanized baffle and becomes diverted to flow over wall #3. Once getting to the exhaust the bulk of the fluid exits the system, however, a portion re-enters the cavity following wall #2. When the bulk of the flow runs into wall #1 it turns again. In this manner a recirculating flow pattern (clockwise) is set up that is opposite that of FIG. #1.

In the system the mechanized baffle will be constantly changing states from position #1 to position #2. The actual frequency and angles of motion can be optimized for each particular system. Notice that in this unsteady state flow that the thermal and fluid boundary layers above the electronics are constantly changing, thus enhancing heat transfer. Notice that with small changes in the mechanized baffle (for example a 90 degree change) that the airflow completely reverses direction. This occurs at every location in the electronics cavity.

The mechanized baffle can be operated by a motor in either a continuous motion or a series (set) of discrete motions.

ALTERNATIVES TO THE PREFERRED EMBODIMENT

The mechanized baffle can be of many different sizes and shapes. One possibility is that the baffle is a simple rectangular plate. Another option is that the baffle consists of two pieces at right angles to each other. One piece could be a solid plate, the other could be similar to a scoop that has multiple exhaust jets. The number and size of the jets could be optimized for each particular system.

While we have described our preferred embodiment of our invention, it will be understood that those skilled in the art, both now and in the future, may make various improvements and enhancements which fall within the scope of the claims which follow. These claims should be construed to maintain the proper protection for the inventions first disclosed.

What is claimed is:

1. A cooling system for a computer having electrical components as part thereof, said cooling system comprising:
   a housing including a plurality of walls and an entrance, said housing adapted for having said electrical components positioned therein;
   means for providing fluid to said housing through said entrance;
   exhaust means for exhausting said fluid provided said housing at a location other than said entrance;
   baffle means located within said housing relative to said entrance for occupying first and second positions within said housing with respect to said fluid provided said housing, said baffle means in said first position enabling said fluid to pass thereover and also directing said fluid whereby said fluid will strike said walls and move about said housing in a first direction of circulating flow, said baffle means in said second position substantially directing said fluid, whereby said fluid will strike said walls and move in a second direction of circulating flow about said housing substantially opposite to said first direction of flow, only part of said fluid moving in both of said directions of directed, circulating flow being removed from said housing by said exhaust means;
   means for moving said baffle means between said first and second positions at a rate sufficient to create an unsteady state of turbulent flow of said fluid within said housing above said electrical components, thereby enhancing cooling of said components.

2. The cooling system of claim 1 wherein said housing includes at least three walls, said fluid moving along a first of said walls to strike a second wall and thereafter a third wall during said first direction of circulatory flow, said fluid moving along said third wall and striking said second and first walls during said second direction of circulatory flow.

3. The cooling system of claim 2 wherein said housing includes a fourth wall intermediate said second and third walls, said means for exhausting said fluid associated with said fourth wall such that said part of said fluid will exit through said fourth wall during both of said directions of circulatory flow.

4. The cooling system of claim 1 wherein said baffle means is a rectangular plate.

5. The cooling system of claim 1 wherein said means for moving said baffle means comprises a motor.

6. The cooling system of claim 5 wherein said means for moving said baffle means between said first and second positions moves said baffle means in a continuous manner of movement.

7. The cooling system of claim 5 wherein said means for moving said baffle means between said first and second positions moves said baffle means in a series of discrete motions.

8. The cooling system of claim 5 wherein said means for exhausting said fluid comprises a fan.

* * * * *